United States Patent [19]

Maruyama et al.

[11] Patent Number: 5,200,799
[45] Date of Patent: Apr. 6, 1993

[54] SYSTEM FOR OPTICALLY INSPECTING CONDITIONS OF PARTS PACKAGED ON SUBSTRATE

[75] Inventors: Yuji Maruyama, Tokyo; Yukifumi Tsuda, Kawasaki; Kazutoshi Ikegaya, Sagamihara; Kunio Sannomiya, Atsugi; Hiroto Toba; Takumi Seto, both of Yokohama, all of Japan

[73] Assignee: Matsushita Electric Industrial Co., Ltd., Osaka, Japan

[21] Appl. No.: 580,547

[22] Filed: Sep. 11, 1990

[30] Foreign Application Priority Data

Sep. 12, 1989 [JP] Japan .................................. 1-236158
Jun. 29, 1990 [JP] Japan .................................. 2-173449

[51] Int. Cl.$^5$ .......................... G01B 11/00; H01J 3/14; G01N 21/86
[52] U.S. Cl. ..................................... 356/394; 250/235; 250/561
[58] Field of Search ............... 356/394, 398, 388, 376, 356/237; 250/560, 561, 235; 382/8

[56] References Cited

U.S. PATENT DOCUMENTS

| | | | |
|---|---|---|---|
| 3,975,102 | 8/1976 | Rosenfeld et al. | 356/394 |
| 4,627,734 | 12/1986 | Rioux | 356/376 |
| 4,674,869 | 6/1987 | Pryor et al. | 356/394 |
| 4,796,997 | 1/1989 | Svetkoff et al. | 356/376 |
| 4,910,690 | 3/1990 | Fujita | 356/394 |
| 4,983,827 | 1/1991 | Ikegaya et al. | 250/235 |
| 5,004,929 | 4/1991 | Kakinoki et al. | 356/376 |
| 5,027,418 | 6/1991 | Ikegaya et al. | 382/8 |
| 5,103,105 | 4/1992 | Ikegaya et al. | 356/376 |

OTHER PUBLICATIONS

Patent Abstracts of Japan vol. 11, No. 62 (P-551) (2509), Feb. 25, 1987 and JP-A-61225606 (Sumitomo Metal) Jul. 10, 1986.

*Primary Examiner*—Richard A. Rosenberger
*Assistant Examiner*—Hoa Q. Pham
*Attorney, Agent, or Firm*—Pollock, VandeSande & Priddy

[57] ABSTRACT

A system for inspecting a condition of parts packaged on a printed-circuit board. The inspection system includes a position detecting device to receive scattered light due to illumination of the printed-circuit board with a laser beam and convert the received scattered light into a position signal. This position signal is used for obtaining luminance data and at least two height data of the parts on the printed-circuit board. Proper height data of the parts is determined on the basis of the difference between the two height data. The inspection system determines the package condition by comparing the final height data with a predetermined reference data.

1 Claim, 6 Drawing Sheets

SYSTEM FOR OPTICALLY INSPECTING CONDITIONS OF PARTS PACKAGED ON SUBSTRATE

BACKGROUND OF THE INVENTION

The present invention relates generally to inspection systems, and more particularly to an optical inspection system for checking the presence of poor conditions of mounted parts on a substrate such as position inaccuracy, lacks, rising and soldering fault of parts packaged or installed on a printed-circuit board.

Recently, improvement is being made for size-reduction and high-density packaging of parts to be installed on a printed-circuit board, whereby difficulty is encountered to accurately check the packaging conditions of the parts on the printed board through the visual inspection. In order to cope with such a situation, there has been proposed a system which automatically inspect the packaging conditions of the parts on the printed-circuit board on the basis of data optically taken through an optical apparatus such as a video camera and others. There is a problem which arises with such conventional optical inspection systems, however, in that difficulty is encountered in obtaining accurate data in terms of the heights of the parts on the printed board due to regular reflection light from metallic surfaces of the parts and printed-circuit board, shadows of the parts, and others. In addition, in cases where the intensity of the reflection light from the printed board and/or the parts thereon due to illumination of a light beam is extremely high or low, it is difficult in practice to accurately and quickly measure the height data for all the parts on the printed-circuit board, because of difference in dynamic range between the reflection light and an image-processing unit for processing an image due to the reflection light so as to obtain height data of the parts on the printed-circuit board. This causes inspection for only given parts to be unavoidable so as to reduce the inspection accuracy as a whole. Thus, a further improvement is required with a view to heightening the accuracy of the height data of the parts to increase the inspection accuracy.

SUMMARY OF THE INVENTION

It is therefore an object of the present invention to provide an optical inspection system which allows accurate three-dimentional inspection by accurately obtaining the height data of the parts packaged on a substrate.

In accordance with the present invention, there is provided a system for inspecting packaging condition of parts packaged on a printed-circuit board, comprising: transferring means for moving said printed-circuit board in a predetermined direction; light source means for emitting a light beam; scanning means for optically scanning a surface of said printed-circuit board with the light beam emitted from said light source means; a pair of optical means for reflecting, at symmetrical positions with respect to the scanning plane, scattered light due to the scanning of said printed-circuit board peformed by said scanning means and condensing the reflected light; a pair of position detection means each disposed to be responsive to the condensed reflected light for respectively generating photoelectric signals I1 and I2 corresponding to an incident position thereon; first calculation means for calculating luminance data L1 and L2 and height data P1 and P2 on the basis of said photoelectric signals I1 and I2; second calculation means coupled to said first calculation means for determining a final height data, said second calculation means outputting as said final height data an average value $(P1 + P2)/2$ of said height data P1 and P2 when $|P1-P2| \leq \Delta P$, outputting as said final height data said height data P1 when $|P1-P2| > \Delta P$, $L_{MAX} > L1 > L_{MIN}$ and $L_{MAX} > L2 > L_{MIN}$ $L1 > L2$, outputting as said final height data said height data P2 when $|P1-P2| > \Delta P$, $L_{MAX} > L1 > L_{MIN}$, $L_{MAX} > L2 > L_{MIN}$ and $L2 > L1$, outputting as said final height data said height data P1 when $L_{MAX} > L1 > L_{MIN}$ and $L_2 \geq L_{MAX}$ or $L_{MIN} \geq L2$, outputting as said final height data said height data P2 when $L_{MAX} > L2 > L_{MIN}$ and $L1 \geq L_{MAX}$ or $L_{MIN} \geq L1$, and outputting zero as said final height data when $L1 \geq L_{MAX}$ or $L_{MIN} \geq L1$ and $L2 \geq L_{MAX}$ or $L_{MIN} \geq L2$ where $\Delta P$ represents a predetermined height difference threshold, $L_{MAX}$ designates a predetermined higher luminance threshold, $L_{MIN}$ denotes a predetermined lower luminance threshold; and decision means coupled to said second calculation means for comparing the height data outputted from said second calculation means with predetermined reference data to decide the package condition of said parts on said printed-circuit board.

That is, a printed-circuit board having on its surface parts which are optically and entirely scanned with a laser beam emitted from a laser light source and the scattered light due to the scanning of the printed-circuit board is reflected by a pair of reflection mirrors disposed symmetrically with respect to the scanning direction and then condensed by a pair of condensing lenses so as to form light spots on optical position detecting devices. In response to the formation of the light spots, each of the optical position detecting devices generates photoelectric current signals I1 and I2 corresponding to the condensed position thereon. The photoelectric current signals I1 and I2 are processed to obtain luminance data L1 and L2 and further to obtain height data P1 and P2 of the parts on the printed-circuit board. The difference between the height data P1 and P2 is calculated in order to obtain correct data. If the difference therebetween is small, the average value of the height data P1 and P2 is adopted as proper height data. On the other hand, if the difference therebetween is great, one of the height data P1, P2 and zero-data is selected on the basis of the luminance data L1 and L2 and adopted as the proper height data. The proper height data are compared with reference data in order to check the package condition of the parts on the printed-circuit board. This arrangement allows accurate three-dimensional inspection and automization of the inspection.

In accordance with the present invention, there is further provided a system for obtaining a condition of parts packaged on a printed-circuit board, comprising: transferring means for moving said printed-circuit board; light source means for emitting a light beam; scanning means for scanning a surface of said printed-circuit board with said light beam emitted from said light source means; optical means for reflecting scattered light due to the scanning of said printed-circuit board and condensing the reflected scattered light; position detecting means disposed at a position where the reflected scattered light is condensed by said optical means, said position detecting means outputting a photoelectric signal in correspondance with the condensed scattered light; digitizing means for amplifying and digitizing said photoelectric signal outputted from said position detecting means and outputting a digitized signal; calculation means for calculation height data of said parts on said printed-circuit board on the basis of the output signal of said digitizing means; level decision means for deciding a level of said photoelectric signal from said position detecting means; and decision means for determining the package condition of said parts on said printed-circuit board by comparing said height data from said calculation means with predetermined reference height data, wherein said digitizing means comprises a plurality of amplifiers whose gains are different from each other, a plurality of analog-to-digital converters for digitizing outputs of said plurality of amplifiers and selection means for selecting one of the outputs of said plurality of analog-to-digital converters in accordance with the output of said level decision means, and said calculation means calculates said height data on the basis of the analog-to-digital converter output selected by said

BRIEF DESCRIPTION OF THE DRAWINGS

The object and features of the present invention will become more readily apparent from the following detailed description of the preferred embodiments taken in conjunction with the accompanying drawings in which.

DETAILED DESCRIPTION OF THE INVENTION

Figure 1:
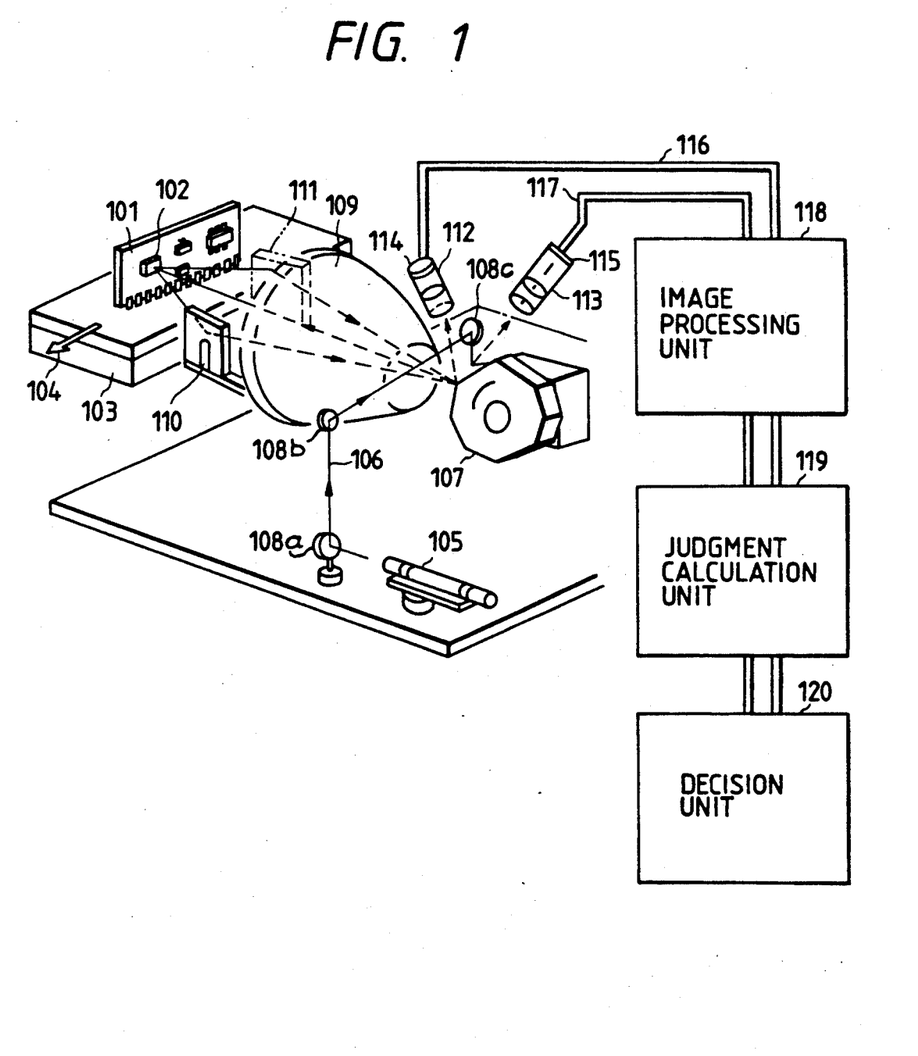
FIG. 1 is a schematic illustration for describing an inspection system according to a first embodiment of the present invention.

Referring now to FIG. 1, there is schematically illustrated an optical inspection system according to a first embodiment of the present invention. In FIG. 1, illustrated at numeral 105 is a laser light source which emits a laser beam. The laser beam emitted therefrom advances through reflection mirrors 108a to 108c as illustrated by numeral 106 to reach a polygon mirror 107 which is rotatable by a driving device 107a. The laser beam reflected on the rotating polygon mirror 107 passes through an fθ lens 109 and then reach a printed board 101 so as to perpendicularly illuminate a surface of the printed board 101 on which parts 102 are packaged. The printed board 101 is mounted on a transferring device 103 so as to be movable in a direction indicated by an arrow 104, whereby the surface of the printed board is entirely and two-dimensionally illuminated with the laser beam reflected in accordance with the rotation of the fθ lens 109. The scattered light due to the laser beam incident on the surface of the printed board 101 is reflected by a pair of reflection mirrors 110 and 111 disposed between the printed board 101 and the fθ lens 109 and symmetrical with respect to the illumination (scanning) direction of the laser beam from the fθ lens 109 to the printed board 101. The reflection (scattered) lights are led through the fθ lens 109, the polygon mirror 107, condensing lenses 112 and 113 up to optical position detecting devices 114 and 115, respectively, which are disposed in symmetrical relation to each other about the scanning plane of the laser beam. The optical position detecting devices 114 and 115 are respectively arranged to produce photoelectric current signals (detection signals 116 and 117) in correspondance with the condensed positions of the scattered and reflected lights on sensing surfaces thereof due to the condensing lenses 112 and 113. For example, each of the optical position detecting devices 114 and 115 is constructed by a PSD (Position Sensitive Detector), for example, the type of which is such that the current flowing through both end electrodes is inversely proportional to the distance therebetween. That is, in response to the incident light spot, the PSD generates a photoelectric current which is in turn divided into two currents I1 and I2 flowing to two output terminals through a P-type resistive layer, respectively. The intensity of the current I1 is obtained by dividing the photoelectric current at an inverse ratio of distances: one is a distance from the beam spot to one output terminal and the other is a distance from the beam spot to the other output terminal. Therefore, the position of the beam pot on the PSD is detected by measuring current intensities of the two output terminals. The PSD has been manufactured by HAMAMATSU PHOTONICS CO., LTD., may be employed for the optical position detecting devices 114 and 115. In response to the reflection lights therefrom, the optical position detecting devices 114 and 115 respectively output detection signals 116 and 117 each comprising components I1 and I2 which are led to an image processing unit 118. The image processing unit 118 performs a calculation by which the detection signals I1 and I2 are converted into luminance data L1 and L2 and height data P1 and P2 of the parts 102 packaged on the printed board 101. The luminance data L1, L2 and the height data P1, P2 are inputted therefrom to a judgment calculation unit 119. The judgment calculation unit 119 determines final or proper height data on the basis of the luminance data L1, L2 and the height data P1, P2. That is, comparison is made between the height data P1 and P2, and if the difference therebetween is relatively small, the average value of the height data P1 and P2 is determined as the final height data, and if the difference therebetween is relatively great, the final data is determined by selecting one of the height data P1, P2 and zero data on the basis of the luminance data L1 and L2 and supplied to a decision calculation unit 120. In a decision unit 120, the height data supplied from the judgment calculation unit 119 are compared with predetermined data so as to decide the packaging condition of the parts 102 on the printed board 101.

With the above-described operation being repeatedly performed, it is possible to inspect the parts-package conditions for the entire surface of the printed board 101. This consecutive operations may be performed in synchronism with signals in conjunction with the rotation of the polygon mirror 107.

Figure 2:
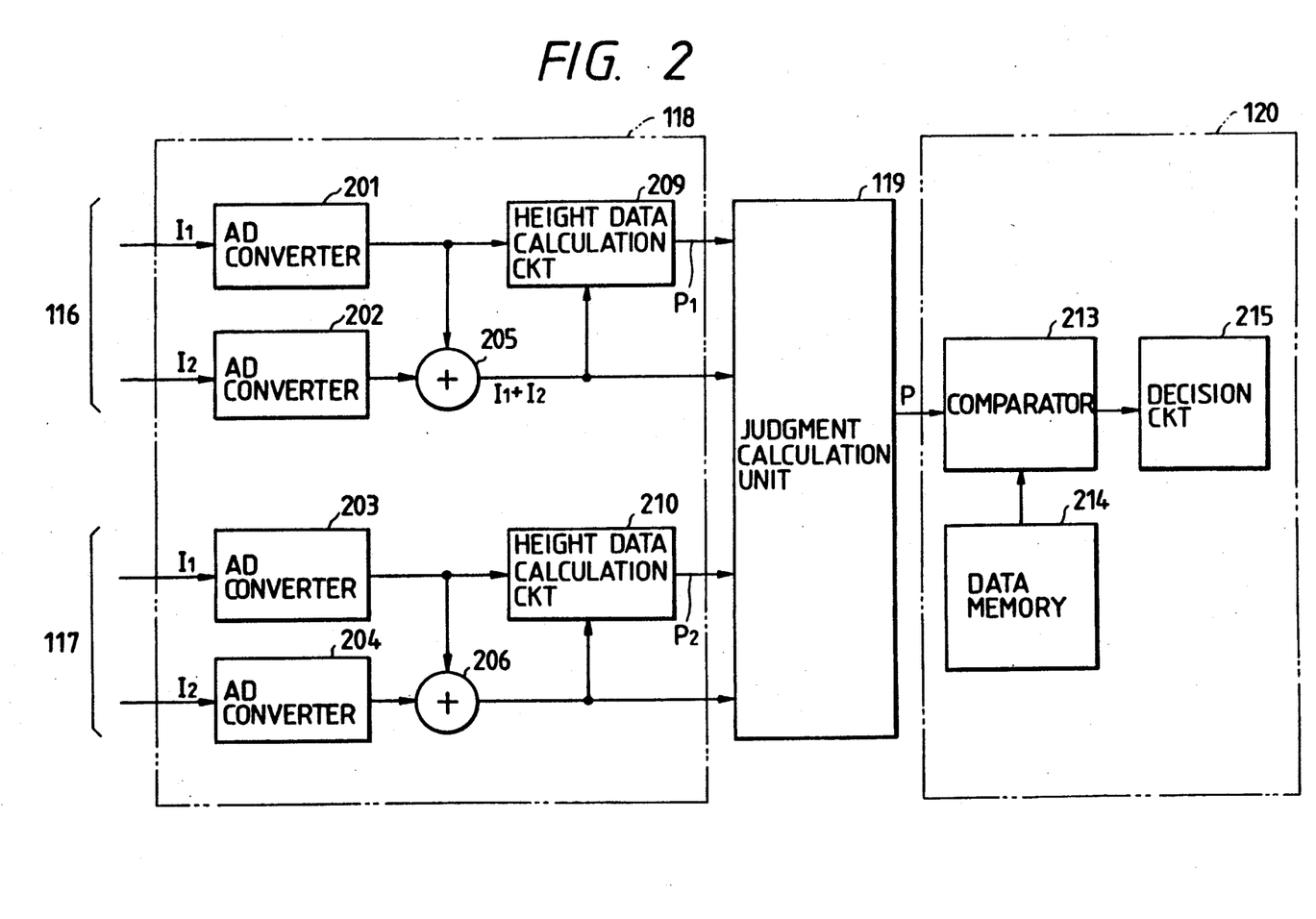
FIGS. 2 and 3 are block diagrams showing a circuit arrangement for inspecting a package condition of parts on a printed-circuit board by obtaining height data of the parts in the first embodiment.

The image processing unit 118, the judgment calculation unit 119 and decision unit 120 will hereinbelow be described in detail with reference to FIGS. 2 and 3. In FIG. 2 the image processing unit 118 includes a first pair of analog-to-digital converters (A/D converters) 201 and 202 to convert the components I1 and I2 of the detection signal 116 into digital signals and a second pair of A/D converter to convert the components I1 and I2 of the detection signal 117 into digital signals.

The output signals (I1, I2) of the A/D converters 201 and 202 are respectively supplied to an adder 205 so as to produce a luminance signal L1 (I1 + I2) and the output signals (I1, I2) of the A/D converters 203 and 204 are respectively supplied to an adder 206 so as to produce a luminance signal L2 (I1 + I2). Also included in the image processing unit 118 are height data calculation circuits 209 and 210 which are coupled to the output sides of the A/D converters 201 and 203 and further to the output sides of the adders 205 and 206, respectively, so as to calculate the height data P1 and P2 on the basis of the output signals (I1) of the A/D converters 201 and 203 and the output signals, i.e., luminance signal L1 and L2, of the adders 205 and 206 in accordance with the following equation (1).

$$P1 \text{ or } P2 = K \cdot I1/(I1 + I2) \qquad (1)$$

where K represents a normalization coefficient.

The judgment calculation unit 119 is responsive to the height data P1 and P2 and the luminance data L1 and L2 from the image processing unit 118 to, as described above, perform the comparison between the height data P1 and P2 so that the average value of the height data P1 and P2 is determined as the final height data when the difference therebetween is small and one selected from the height data P1, P2 and zero data is determined as the final height data P when the difference therebetween is great. The final height data is supplied to the decision unit 120. The decision unit 120 comprises a comparator 213 which is responsive to the final height data P from the judgment calculation unit 119 and which is accessible to a data memory 214 storing a reference height data. The comparator 213 compares the height data P with the reference height data to obtain the difference therebetween. The output signal of the comparator 213 indicative of the difference therebetween is supplied to a decision circuit 215 which in turn determines the package condition of the parts 102 on the printed board 101 on the basis of the difference therebetween.

Figure 3:
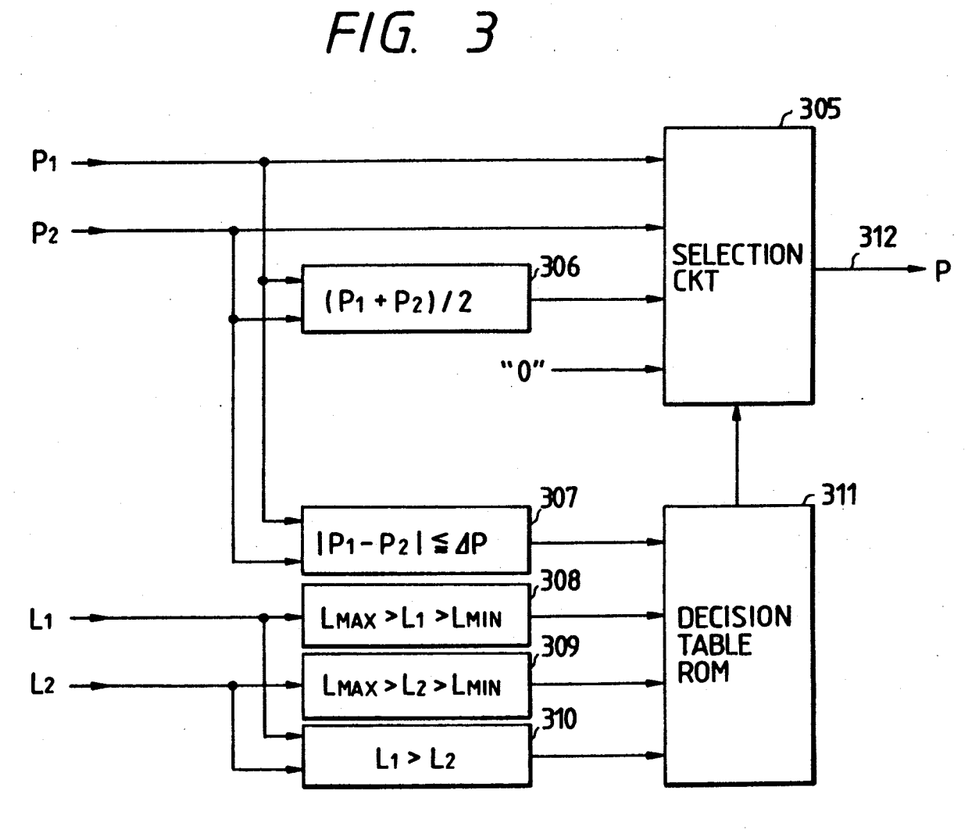

FIG. 3 is a block diagram showing a circuit arrangement of the judgment calculation unit 119. In FIG. 3, the height data P1 and P2 are inputted to a selection circuit 305, an average calculation circuit 306 and a difference calculation circuit 307. A "0" data is also inputted to the selection circuit 305. In response to the inputs of the height data P1 and P2, the average calculation circuit 306 calculates an average value of the height data P1 and P1 and the difference calculation circuit 307 calculates the difference therebetween. The output of the average calculation circuit 306 is supplied to the selection circuit 305 and the output of the difference calculation circuit 307 is supplied to a decision table random-only memory (ROM) 311. On the other hand, the luminance data L1 is supplied to comparators 308 and 310 and the luminance data L2 is supplied to a comparator 309 and the comparator 310. The respective outputs of the comparators 308 to 310 are supplied to the decision table ROM 311.

In the difference calculation circuit 307, the calculated difference between the height data P1 and P2 is compared with a difference threshold $\Delta P$. In the case of $|P1 - P2| \leq \Delta P$, the difference calculation circuit 307 outputs a binary "1" signal to the decision table ROM 311, and in the case of $|P1 - P2| > \Delta P$, the difference calculation circuit 307 outputs a binary "0" signal thereto. The comparators 308 and 309 compare the luminance data L1 and L2 with predetermined higher and lower luminance thresholds $L_{MAX}$ and $L_{MIN}$, respectively. In the case of $L_{MAX} > L1 > L_{MIN}$, the comparator 308 outputs a binary "1" signal to the decision table ROM 311, and in the case of $L_{MAX} > L2 > L_{MIN}$, the comparator 309 outputs a binary "1" signal thereto. If not, the comparators 308 and 309 respectively output binary "0" signals thereto. Further, the comparator 310 performs the comparison between the luminance data L1 and L2 and then supplies the comparison results to the decision table ROM 311. That is, the comparator 310 outputs a binary "1" signal thereto when $L1 > L2$ and outputs a binary "0" signal when $L1 < L2$.

The following is the decision table of the decision table ROM 311.

| | | | | | | | |
|---|---|---|---|---|---|---|---|
| $|P1-P2| \leq \Delta P$ | 1 | 0 | 0 | 0 | 0 | 0 | 0 |
| $L_{MAX} > L1 > L_{MIN}$ | — | 0 | 1 | 1 | 0 | 1 | 0 |
| $L_{MAX} > L2 > L_{MIN}$ | — | 0 | 0 | 1 | 1 | 1 | 0 |
| $L1 > L2$ | — | 0 | 1 | 1 | 0 | 0 | 1 |
| $P = (P1 + P2)/2$ | 1 | 0 | 0 | 0 | 0 | 0 | 0 |
| $P = P1$ | 0 | 0 | 1 | 1 | 0 | 0 | 0 |
| $P = P2$ | 0 | 0 | 0 | 0 | 1 | 1 | 0 |
| $P = 0$ | 0 | 1 | 0 | 0 | 0 | 0 | 1 |

In the selection circuit 305, in the case that the difference between the height data P1 and P2 is smaller than the height threshold $\Delta P$, then the average value of the height data P1 and P2 is selected as the final height data P, and in the case that the difference therebetween is greater than $\Delta P$, under a consideration that the height data P1 and P2 are incorrect data due to regular reflection on the printed board 101, shadow of the parts 102 or others, one of the height data P1, P2 and the zero data is selected as the final height data P in accordance with the decision table of the decision table ROM 311.

Figure 4:
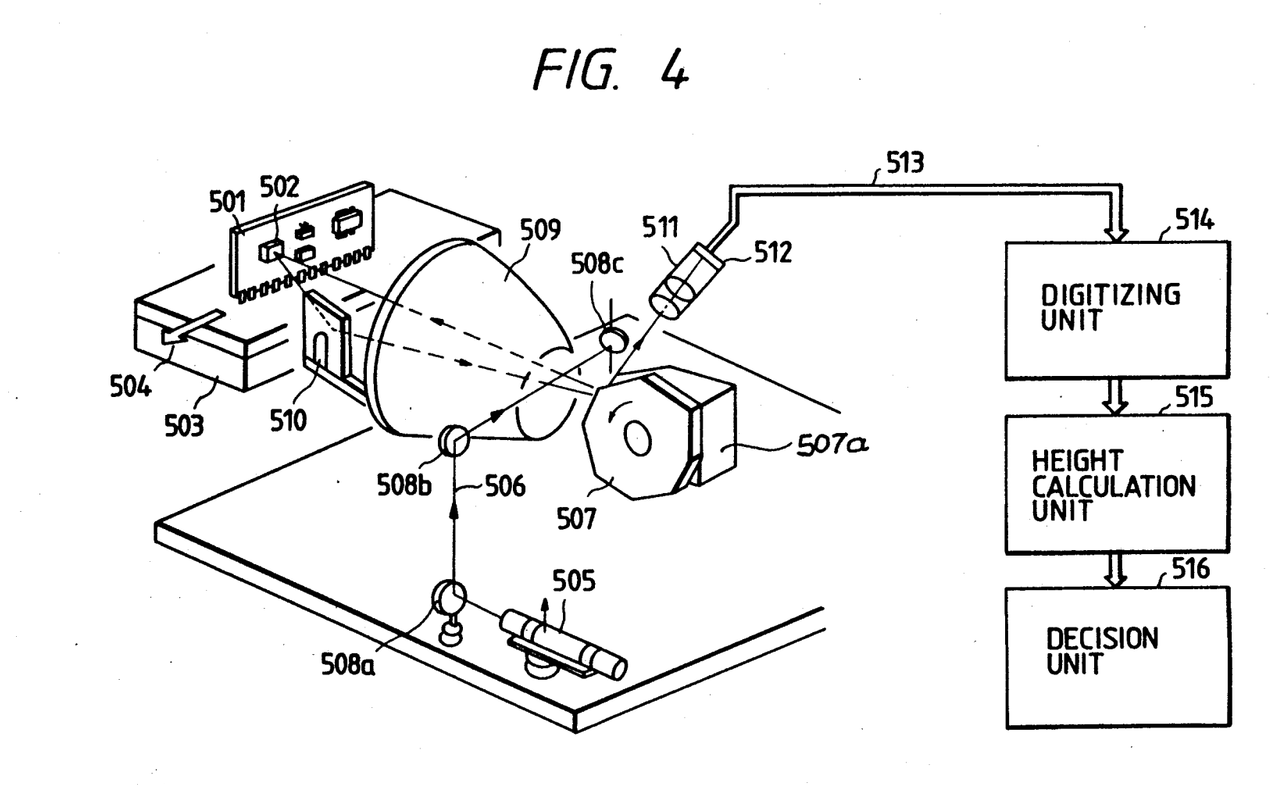
FIG. 4 is a schematic illustration for describing an inspection system according to a second embodiment of the present invention.
Figure 5:
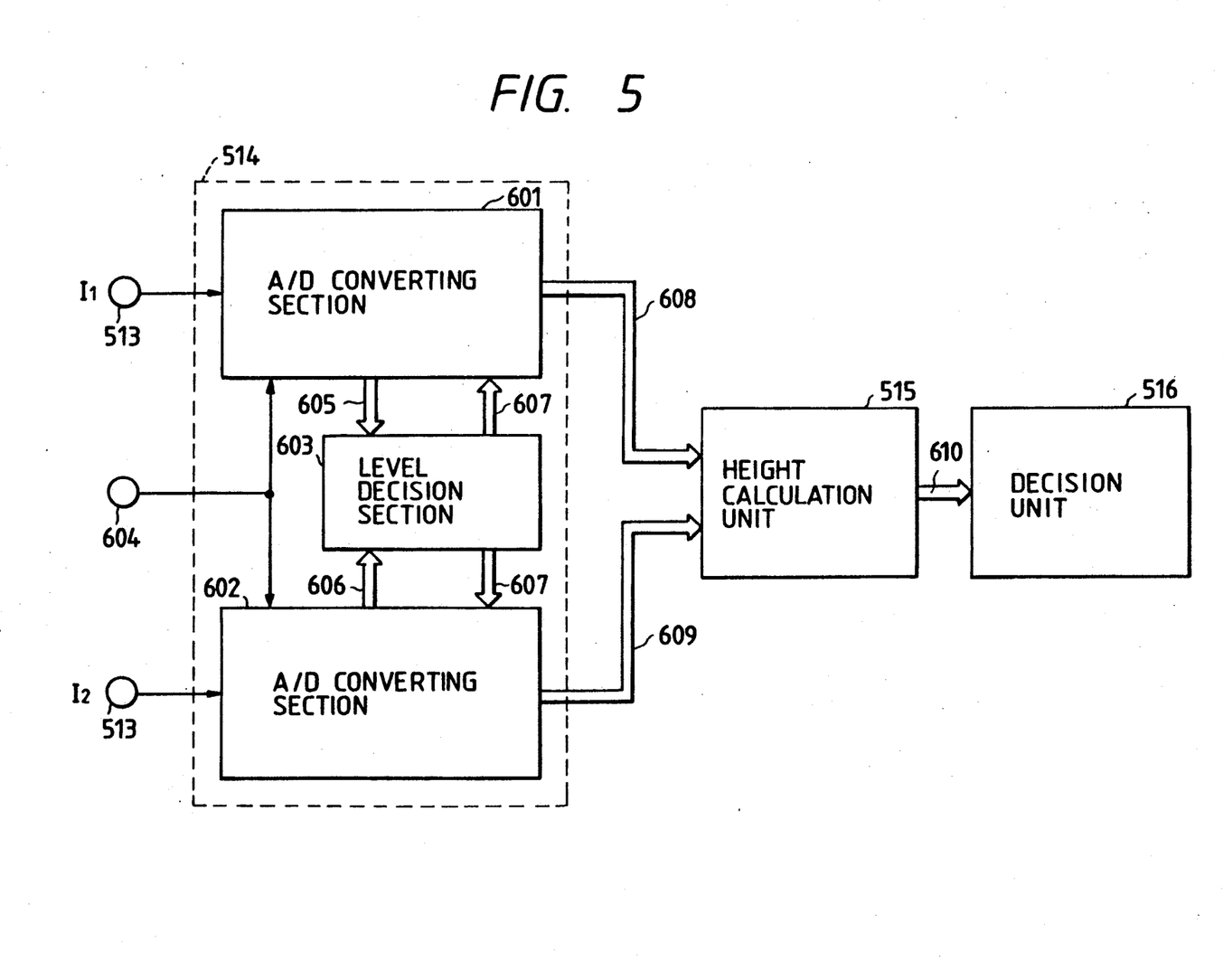
FIGS. 5 and 6 are circuit diagrams showing a circuit arrangement for inspecting a package condition of parts on a printed-circuit board in the second embodiment.
Figure 6:
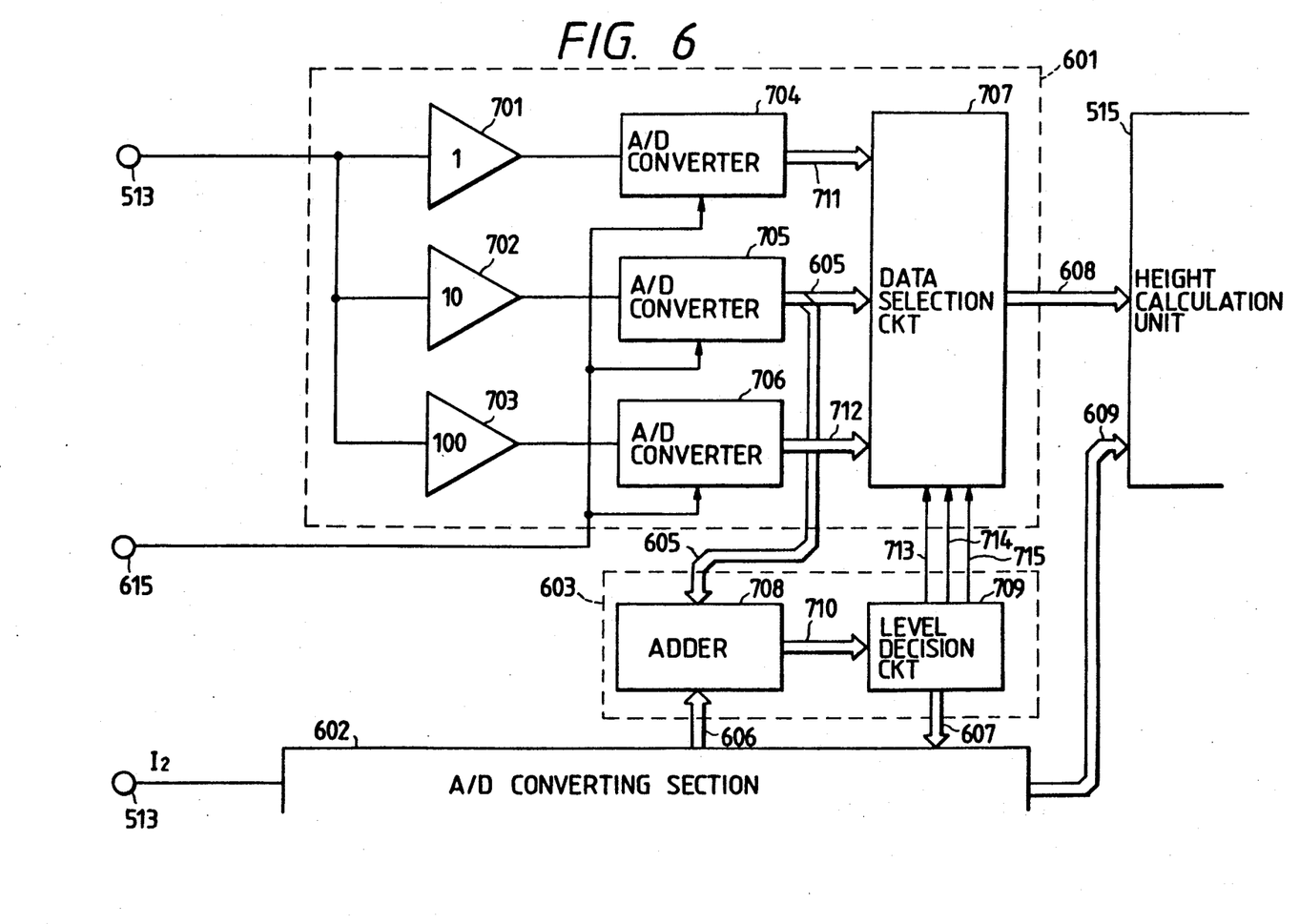

A description will be made hereinbelow in terms of a second embodiment of this invention with reference to FIGS. 4 to 6. In FIG. 4, a laser beam emitted from a laser light source 505 reaches a polygon mirror 507 after being reflected by reflection mirrors 508a to 508c as illustrated at numeral 506. The laser beam reflected by the polygon mirror 507 which is rotated by driving device 507a, passes through an $f\theta$ lens 509 so as to perpendicularly illuminate or scan one surface of a printed-circuit board 501 on which parts 502 is packaged and which is mounted on a transferring device 503 so as to be movable in a direction indicated by an arrow 504 at a predetermined speed. Here, the rotation of the polygon mirror 507 allows vertical scanning for the printed-circuit board 501 and the movement of the transferring device 503 causes horizontal scanning therefor, thereby scanning the entire surface of the printed-circuit board 501. In response to the illumination of the printed-circuit board 501, the laser beam is scattered and a portion of the scattered light is reflected by a light-cutting mirror 510 which is disposed between the printed-circuit board 501 and the $f\theta$ lens 509, and then led through the $f\theta$ lens 509, the polygon mirror 507 and a condensing lens 511 to a sensing surface of an optical position detecting device such as Position Sensitive Detector (PSD) 512. The optical position detecting device 512 generates a detection signal, i.e., a photoelectric current signal 513, comprising two components I1 and I2, in correspondence with the displacement (or position) of the light spot formed thereon due to the condensing lens 511. The displacement of the light spot on the sensing surface of the optical position detecting device 512 is in proportional relation to the height of the parts 502 on the printed-circuit board 501, that is, the position of the light spot on the sensing surface thereof is proportionally displaced in accordance with variation of the height of the parts 502 on the printed-circuit board 501. Thus, the detection signals I1 and I2 correspond to the height of the parts 502 on the printed-circuit board 501, and the height data H can be obtained on the basis of the detection signals I1 and I2 in accordance with the following equation.

$$H = K \cdot (I1 - I2)/(I1 + I2) \quad (2)$$

where K is a normalization coefficient.

This equation (2) is made under the basis that the height data becomes zero when the light spot is positioned at the center of the sensing surface of the optical position detecting device 512. If taking the basis when the light spot is positioned at an end portion of the sensing surface thereof, the numerator (I1−I2) of the equation (2) is changed to I1 or I2, resulting in the above-mentioned equation (1).

The output signal 513 of the optical position detecting device 512 is supplied to a range-changeable digitizing unit 514 to as to be digitized with an adequate level. The output signal of the range-changeable digitizing unit 514 is supplied to a height calculation unit 515 to calculate the height data of the parts 502 on the printed-circuit board 501 on the basis of the output signal of the range-changeable digitizing unit 514. The calculation in the height calculation unit 515 is made in accordance with the above-mentioned equation (2) or a table corresponding to the above-mentioned equation (2). Furthermore, the output signal of the height calculation unit 515 indicative of the calculation result is led to a decision unit 516 where the calculated height data are compared with predetermined reference height data to check the packaging condition of the parts 502 on the printed-circuit board 501.

With the above-described operation being effected repeatedly, inspection can be performed for the entire surface of the printed-circuit board 501. Here, the consecutive operations are effected in response to synchronizing signals indicative of the scanning start and generated in response to detection of one end of the printed-circuit board 501, synchronizing signals indicative of the start of the scanning for one-line, and clock signals indicative of the timing corresponding to every pixel. The description of these signals will be omitted for brevity.

An arrangement of the range-changeable digitizing unit 514 will be described hereinbelow with reference to FIG. 5. In FIG. 5, the range-changeable digitizing unit 514 comprises two A/D (analog-to-digital) converting sections 601 and 602 whose ranges are different from each other and a level decision section 603 arranged to decide the range of an input signal thereto. In response to inputs of the detection signals I1 and I2 from the optical position detecting device 512, the A/D converting sections 601 and 602 simultaneously digitize the detection signals I1 and I2, and the digitized detection signals 605 and 606 are respectively supplied to the level decision section 603 which in turn decides the level of the output signal of the optical position detecting device 512. The decision results 607 of the level decision section 603 are respectively fed back to the A/D converting sections 601 and 602, thereby selecting one of the digitized input signals as will be described hereinafter. The output signals of the A/D converting sections 601 and 602 are respectively supplied as range-changed detection signals 608 and 609 to the height calculation unit which in turn calculates height data on the basis of the range-changed detection signals 608 and 609 whose effective ranges are widened. In FIG. 5, numeral 604 is a conversion start signal for the A/D converters 601 and 602 which is produced with a clock signal which is a timing signal at every picture element.

A further description will be made hereinbelow with reference to FIG. 6 in terms of the arrangements of the A/D converting section 601 and level decision section 603 illustrated in FIG. 5. The arrangement of the A/D converting section 602 will be omitted because of being substantially the same as the A/D converter 601. In FIG. 6, the A/D converting section 601 comprises a plurality of amplifiers 701 to 703 which are coupled to the output signal 513 of the optical position detecting device 512 and whose gains are different from each other, a plurality of analog-to-digital (A/D) converters 704 to 706 coupled to the output sides of the amplifiers 701 to 703, and a data selection circuit 707 coupled to the output sides of the A/D converters 704 to 706. Here, the digitizing unit 514 is designed under the condition that the level of the position signal 513 is in a range of about 1 mV to about 10V.

The component I1 of the position-detection signal 513 is simultaneously amplified at the three amplifiers 701 to 703 whose gains are different from each other. That is, the amplifier 701 amplifies the detection signal I1 to 1 time, the amplifier 702 amplifies it up to ten times, and the amplifier 703 amplifies it up to 100 times. Here, it is also appropriate to set the gains of the amplifiers 701 to 703 to $2^0$, $2^4$ and $2^6$ (i.e., $2^m$: m is an integer) in order to match known binary code type A/D converters. The outputs of these amplifiers 701 to 703 are respectively supplied to the corresponding A/D converters 704 to 706 so as to be digitized therein. Each of the three A/D converters 704 to 706 has therein a sample and hold circuit and has a 12-bit resolution and is used with the full-scale +10V unipolar mode. With this arrangement, the effective resolutions (conversion to the input voltage) of the respective A/D converters 704 to 706 becomes as follows.

A/D converter 704 : 10/4096=2.441 [mV]
A/D converter 705 : 10/4096/10=0.244 [mV]
A/D converter 706 : 10/4096/100=0.024 [mV]

These A/D converters 704 to 706, being closely connected with each other, correspond to a 19-bit A/D converter. Further, this arrangement can keep the conversion speed of the 12-bit A/D converter, thereby allowing high-speed processing.

The level decision section 603 is arranged to automatically change the input range of the A/D converter in 513 so as to always obtain effective data suitable for calculation of the height data. Since the decision of the level of the position-detection signal 513 is required to be performed with an addition signal of the components I1 and I2 thereof, the output 605 of the A/D converter 705 (the intermediate output of the A/D converting section 601) is first added to the output 606 of the corresponding A/D converter, not shown, in the A/D converting section 602 (the intermediate output of the A/D converting section 602) in an adder 708 of the level decision section 603, thereby producing a level decision signal 710. This level decision signal is led to a level decision circuit 709 which in turn decides the level of the position-detection signal 513 using the level decision signal to output range-selection signals 607 (713 to 715). These latter signals decide the optimal range to data selection circuits 707 in the respective A/D converting sections 601 and 602, the outputs of which are supplied to the height calculation unit 515. The following table shows the relation between the input signal and the range-changed output signal in this embodiment.

| Output of Range-Changeable A/D Converting Section to Input Value of Position-Detection Signal | | | | |
|---|---|---|---|---|
| Input Value of Sig. I1 | Output of A/D 704 | Output of A/D 705 | Output of A/D 706 | Range-changed Output |
| 10.0 V | 4095 | | | 4095 |
| . | . | . | . | . |
| . | . | . | . | . |
| . | . | . | . | . |
| 1.0 V | 409 | 4095 | | 4095 (409) |
| . | . | . | . | . |
| . | . | . | . | . |
| . | . | . | . | . |
| 0.1 V | 40 | 409 | 4095 | 4095 (409) (40) |
| . | . | . | . | . |
| . | . | . | . | . |
| . | . | . | . | . |
| 10 mV | 4 | 40 | 409 | 409 (40) (4) |
| . | . | . | . | . |
| . | . | . | . | . |
| . | . | . | . | . |
| 1 mV | 0 | 4 | 40 | 40 (4) (0) |

Because of being different in input range, the outputs of the respective A/D converters 704 to 706 with respect to the input signal value are arranged such that their full scales are shifted by one figure as shown in the above-mentioned table. The level decision signal 710 is obtained by adding the output 605 of the A/D converter 705 in the A/D converting section 601 to the output 606 of the corresponding A/D converter in the A/D converting section 602, and hence is in a range of 8190 to 0. The level decision circuit 709 outputs the range-selection signal on the basis of the level decision signal 710 using a comparator, thereby performing the following selection. That is, (1) when the level decision signal>4095, the output of the A/D converter 704 is selected, (2) when 409< the level decision signal<4095, the output of the A/D converter 705 is selected, and (3) when the level decision signal<409, the output of the A/D converter 706 is selected. In the above-mentioned table, although the "Range-Changed Output" column shows the signal value thus selected, in the case of being connected with a plurality of A/D converters, the maximum value is shown.

With the above-described operation, the range of the inputted position signal 513 is automatically determined in accordance with its level so as to output optimal digital data, thereby accurate height data can be obtained over a wide range. In this embodiment, although the 12-bit A/D converter is used, it is possible to ensure the resolution corresponding to a 19-bit A/D converter. Particularly, since in this embodiment a plurality of amplifiers and a plurality of A/D converters are operated in parallel and the range-changing and data-selection are performed after digitizing, the accuracy of the range-changing is improved and the output data is not affected by the range-changing, thereby accurately obtaining the height data. Moreover, since 12-bit A/D converters are operated in parallel, the processing can be performed at a high speed substantially corresponding to 1 $\mu$s/picture element. In FIG. 6, numeral 615 is a conversion start signal for the A/D converters 601 and 602 which is produced by a clock signal which is a timing signal at every picture element.

It should be understood that the foregoing relates to only preferred embodiments of the present invention, and that it is intended to cover all changes and modifications of the embodiments of this invention herein used for the purposes of the disclosure, which do not constitute departures from the spirit and scope of this invention. For example, the range-changing function described in the second embodiment can be employed for the above-described first embodiment.

What is claimed is:

1. A system for inspecting the packaging condition of parts packaged on a printed-circuit board, comprising:

transferring means for moving said printed-circuit board in a predetermined direction;

light source means for emitting a light beam;

scanning means for optically scanning a surface of said printed-circuit board with the light beam emitted from said light source means;

a pair of optical means for reflecting, at symmetrical positions with respect to the scanning plane, scattered light due to the scanning of said printed circuit board performed by said scanning means and condensing the reflected light;

a pair of position detection means each disposed to be responsive to the condensed reflected light for respectively generating photoelectric signals I1 and I2 corresponding to an incident position thereon;

first calculation means for calculating luminance data L1 and L2 and height data P1 and P2 on the basis of said photoelectric signals I1 and I2;

second calculation means coupled to said first calculation means for determining a final height data, said second calculation means outputting as said final height data an average value $(P1+P2)/2$ of said height data P1 and P2 when $|P1-P2| \leq \Delta P$, outputting as said final height data said height data P1 when $|P1-P2| > \Delta P$, $L_{MAX} > L1 > L_{MIN}$, $L_{MAX} > L2 > L_{MIN}$, and $L1 > L2$, outputting as said final height data said height data P2 when $|P1-P2| > \Delta P$, $L_{MAX} > L1 > L_{MIN}$, $L_{MAX} > L2 > L_{MIN}$ and $L2 > L1$, outputting as said final height data said height data P1 when $L_{MAX} > L1 > L_{MIN}$ and $L2 \geq L_{MAX}$ or $L_{MIN} \geq L2$, outputting as said final height data said height data P2 when $L_{MAX} > L2 > L_{MIN}$ and $L1 \geq L_{MAX}$ or $L_{MIN} \geq L1$, and outputting zero as said final height data when $L1 \geq L_{MAX}$ or $L_{MIN} \geq L1$ and $L2 \geq L_{MAX}$ or $L_{MIN} \geq L2$, where $\Delta P$ represents a predetermined height difference threshold, $L_{MAX}$ designates a predetermined higher luminance threshold, $L_{MIN}$ denotes a predetermined lower luminance threshold; and decision means coupled to said second calculation means for comparing the final height data outputted from said second calculation means with predetermined reference data to decide the package condition of said parts on said printed-circuit board.

* * * * *